(12) United States Patent
Bhakta et al.

(10) Patent No.: US 9,257,200 B2
(45) Date of Patent: Feb. 9, 2016

(54) BIT ERROR TESTING AND TRAINING IN DOUBLE DATA RATE (DDR) MEMORY SYSTEM

(75) Inventors: Dharmesh N. Bhakta, Dublin, CA (US); Derrick Butt, Dublin, CA (US); Curtis M. Webster, San Ramon, CA (US)

(73) Assignee: AVAGO TECHNOLOGIES GENERAL IP (SINGAPORE) PTE. LTD., Singpaore (SG)

( * ) Notice: Subject to any disclaimer, the term of this patent is extended or adjusted under 35 U.S.C. 154(b) by 827 days.

(21) Appl. No.: 13/559,741

(22) Filed: Jul. 27, 2012

(65) Prior Publication Data

US 2014/0029364 A1    Jan. 30, 2014

(51) Int. Cl.
| | |
|---|---|
| *G11C 29/00* | (2006.01) |
| *G11C 29/02* | (2006.01) |
| *G11C 29/56* | (2006.01) |
| G11C 11/40 | (2006.01) |

(52) U.S. Cl.
CPC ........ *G11C 29/022* (2013.01); *G11C 29/56008* (2013.01); *G11C 29/56012* (2013.01); *G11C 11/40* (2013.01); *G11C 2029/5602* (2013.01)

(58) Field of Classification Search
CPC .............. G11C 29/025; G11C 29/023; G11C 29/56004; G11C 29/56008; G11C 29/84; G11C 29/842; G06F 11/221; G06F 11/263
USPC .................. 365/201, 189.14, 189.15, 189.16, 365/189.05, 189.08; 714/42, 43
See application file for complete search history.

(56) References Cited

U.S. PATENT DOCUMENTS

| | | | | | |
|---|---|---|---|---|---|
| 6,819,599 | B2* | 11/2004 | Schaefer | .............. | G11C 7/1045 365/189.07 |
| 7,546,499 | B1* | 6/2009 | Shafer | .............. | G01R 31/31715 714/725 |
| 8,035,407 | B2* | 10/2011 | Jarboe, Jr. | ........ | G01R 31/31858 324/750.3 |
| 8,422,319 | B2* | 4/2013 | Sriadibhatla | ......... | G11C 29/023 365/193 |
| 8,874,973 | B2* | 10/2014 | Hunt | .................... | G06F 11/0793 711/106 |
| 2010/0077211 | A1* | 3/2010 | Lee | ........................ | G06F 11/263 713/168 |
| 2011/0176374 | A1 | 7/2011 | Jarboe, Jr. et al. | | |

* cited by examiner

*Primary Examiner* — Andrew Q Tran
(74) *Attorney, Agent, or Firm* — Sheridan Ross P.C.

(57) ABSTRACT

DDR PHY interface bit error testing and training is provided for Double Data Rate memory systems. An integrated circuit comprises a bit error test (BERT) controller that provides a bit pattern; and a physical interface having a plurality of byte lanes. A first byte lane is connected by a loopback path to a second byte lane and the BERT controller writes the bit pattern that is obtained using the loopback path to evaluate the physical interface. The evaluation comprises (i) a verification that the bit pattern was properly written and read; (ii) a gate training process to position an internal gate signal; (iii) a read leveling training process to position both edges of a strobe signal; and/or (iv) a write bit de-skew training process to align a plurality of bits within a given byte lane.

19 Claims, 10 Drawing Sheets

FIG. 12 ered to as
BIT ERROR TESTING AND TRAINING IN DOUBLE DATA RATE (DDR) MEMORY SYSTEM

BACKGROUND

When a computer system interfaces with a Double Data Rate source synchronous memory, a DDR controller typically manages the flow of data between the host device for the DDR controller and the DDR memory device(s). The DDR protocol specifies the transfer of data on both the rising and falling edges of the data bus strobe (typically referred to as DQS) signals. The DDR controller typically interfaces with the DDR memory device using a Physical (PHY) interface that converts digital signals and commands from the DDR controller logic into waveforms that the DDR memory can interpret.

As the data rates between the DDR memory and DDR controller increase, it becomes increasingly important to test the robustness of the functionality and timing of the DDR PHY interface. Thus, a number of techniques have been proposed or suggested for the testing of bit errors due to functional and timing issues related to the DDR PHY interface. Existing techniques typically employ external test equipment to exercise and implement a bit error test of the DDR PHY interface. The time required to setup such external test equipment, however, is significant and a relatively large number of pins are typically required to implement the testing. In addition, existing bit error testing techniques typically require that the DDR memory is connected to the DDR controller during testing, via the DDR PHY interface. Furthermore, existing external bit error testing techniques do not permit the DDR controller and the DDR memory to be bypassed to permit proper testing of the PHY interface in isolation.

A need therefor exists for improved methods and apparatus for functional/timing bit error testing of the DDR PHY interface of the overall DDR memory system. A further need exists for improved techniques for bit error testing and training of the DDR PHY interface that do not require the presence of the DDR memory or the DDR memory controller.

SUMMARY OF THE INVENTION

Generally, methods and apparatus are provided for DDR PHY interface bit error testing and training in Double Data Rate (DDR) memory systems. One embodiment of the invention is manifest as an integrated circuit comprising a bit error test controller that provides a bit pattern; and a physical interface having a plurality of byte lanes, wherein the physical interface converts digital signals from the bit error test controller into waveforms for one or more memory devices, wherein at least a first byte lane is connected by a loopback path to a second byte lane and wherein the bit error test controller provides the bit pattern using a write operation that is then obtained using the loopback path to evaluate the physical interface based on the bit pattern.

The evaluation comprises (i) a verification that the bit pattern that was written was also read by the bit error test controller; (ii) a gate training process to position a gate signal for reading one or more read bursts; (iii) a read leveling training process to position an edge of a strobe signal substantially in a middle of a data bit window; and/or (iv) a write bit des-skew training process to substantially align a plurality of bits in a byte lane.

A more complete understanding of embodiments of the invention will be obtained by reference to the following detailed description and drawings.

DETAILED DESCRIPTION

Figure 1:
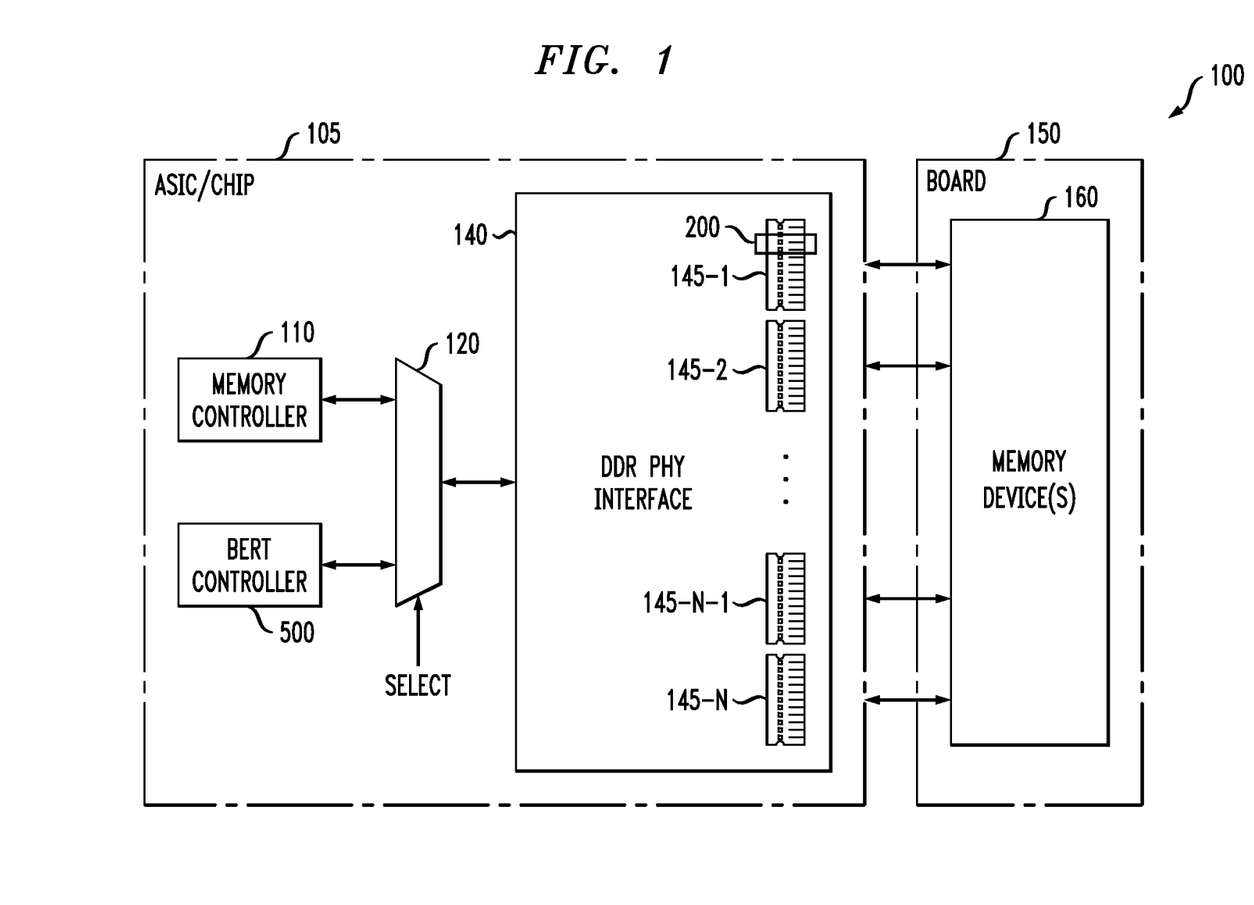
FIG. 1 illustrates an exemplary DDR memory system in which an embodiment of the present invention can be implemented.

Embodiments of the invention can be manifest in improved methods and apparatus for functional/timing bit error testing and training of the DDR PHY interface. FIG. 1 illustrates an exemplary DDR memory system 100 in which the present invention can be implemented. As shown in FIG. 1, the DDR memory system 100 comprises a memory controller 110 interfacing with one or more DDR memory devices 160 by means of a DDR PHY interface 140. In addition, the exemplary DDR memory system 100 comprises a Bit Error Test (BERT) controller 500 (discussed further below in conjunction with FIG. 5) and a multiplexer 120. The DDR PHY interface 140 converts digital signals and commands from the memory controller 110 and BERT controller 500 into waveforms that the DDR memory devices 160 can interpret.

As discussed hereinafter, the exemplary multiplexer 120 selects an output from the memory controller 110 or the BERT controller 500, discussed further below in conjunction with FIGS. 3 and 5, based on a Select signal that is configured based on whether the exemplary DDR memory system 100 is in a normal operating mode or a test/train mode (referred to herein as a test mode), respectively. As discussed further below in conjunction with FIG. 3, in an exemplary test mode of the DDR memory system 100, the multiplexer 120 selects an output from the BERT controller 500. In a normal operating mode of the DDR memory system 100, the multiplexer 120 selects an output from the memory controller 110.

During normal operation, the memory controller 110 drives the DDR PHY interface 140 with write operations to the DDR memory devices 160 and read operations from the DDR memory devices 160. Thus, the write and read paths to and from the DDR memory devices 160 are configured through the DDR PHY interface 140 based on commands from the memory controller 110.

As shown in FIG. 1, the exemplary DDR PHY interface 140 comprises a plurality of bidirectional byte lanes 145-1 through 145-N that are connected to the DDR memory devices 160. In an implementation in accordance with an exemplary JEDEC DDR3 SDRAM standard (see, JEDEC Solid State Technology Association, http://www.jedec.org/standards-documents/docs/jesd-79-3d), the byte lanes 145 comprise eight data bits, one data strobe and either one additional data strobe or a data mask. An exemplary circuit 200 corresponding to an individual bit, strobe or mask from the byte lanes 145 is discussed further below in conjunction with FIG. 2.

In the exemplary embodiment of FIG. 1, the memory controller 110, BERT controller 500 and DDR PHY interface 140 are optionally implemented on a chip 105, such as an Application Specific Integrated Circuit (ASIC). The DDR memory devices 160 may be embodied, for example, as dual in-line memory modules (DIMMs). The DDR memory devices 160 may optionally be part of one or more boards 150, such as a motherboard.

Figure 2:
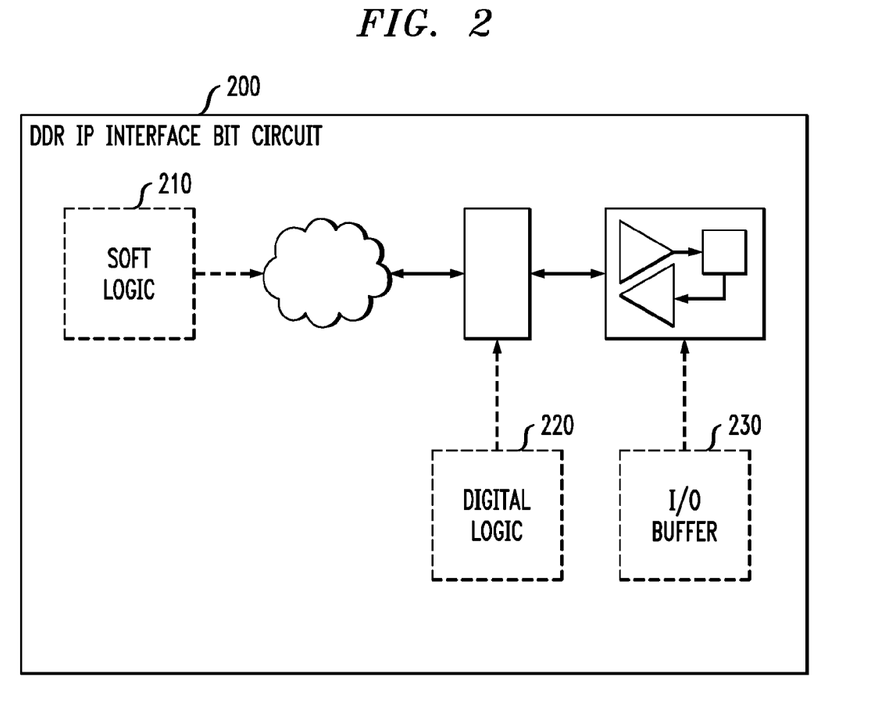
FIG. 2 illustrates the exemplary byte lane circuit of FIG. 1 in further detail.

FIG. 2 illustrates the exemplary byte lane circuit 200 of FIG. 1 in further detail. As shown in FIG. 2, the exemplary byte lane circuit 200 comprises one or more soft logic elements 210, digital logic 220 and input/output (I/O) buffers 230 for an individual bit, strobe or mask for the byte associated with the byte lane 145.

Typically, the soft logic 210 performs the following functions: (i) provides a register interface for maintaining and configuring the digital logic 220 and/or I/O buffers 230; (ii) provides Write and Read Data Path management functions; and (iii) provides Power and DLL management functions. The digital logic 220 typically performs the following functions: (i) performs DDR Data multiplexing, and demultiplexing; and (ii) enables Write and Read strobe delay adjustments. Finally, the I/O buffers 230 typically perform the following functions: (i) supports stub series terminated logic (SSTL) specification that supports DDR2, DDR3, and DDR3L voltage levels; (ii) translates core domain signaling to I/O voltage domain signaling and vice versa; (iii) bi-directional I/O supporting both Transmit and Receive signaling to and from external memory systems; (iv) supports programmable On-Die termination for optimizing signal integrity; and (v) supports programmable Output Impedance for optimizing signal integrity.

DDR memory devices, such as the DDR memory devices 160 of FIG. 1, require data transfer to take place simultaneously with the occurrence of valid data to reduce memory access and propagation delays. Thus, a data strobe signal (typically referred to as DQS) accompanies the data signals. The phase relationship between the DQ and DQS signals is discussed further below in conjunction with FIG. 4. During a read operation, DQS is edge-aligned with DQ (i.e., DQ and DQS are in phase) and is transmitted by the DDR memory devices 160. During a write operation, DQS is center-aligned with DQ (i.e., a 90 degree phase offset) and is transmitted by the memory controller 110. The alignment of DQ and DQS is challenging due to the bidirectional nature of DQS.

As discussed further below in conjunction with FIG. 5, during a test mode, a write operation from the BERT controller 500 provides a test pattern that is then read back using a loopback path to verify that the same pattern that was written by the BERT controller 500 was also read by the BERT controller 500. Thus, the corresponding write and read operations of a given test pattern must be phase aligned. Thus, in addition to the above-described conventional functionality, the digital logic 220 for each bit also ensures that DQS is edge-aligned with DQ (i.e., DQ and DQS are in phase) for a write operation during a test mode. In other words, the digital logic 220 must add a 90 degree phase offset between DQS and DQ for the test pattern that is written, as discussed further below in conjunction with FIGS. 4 and 5. In this manner, when the test pattern that is read back has DQS edge-aligned to DQ (i.e., DQ and DQS are in phase), it can be compared to the test pattern that was written, which will also have DQS edge-aligned with DQ (i.e., DQ and DQS are in phase).

Figure 3:
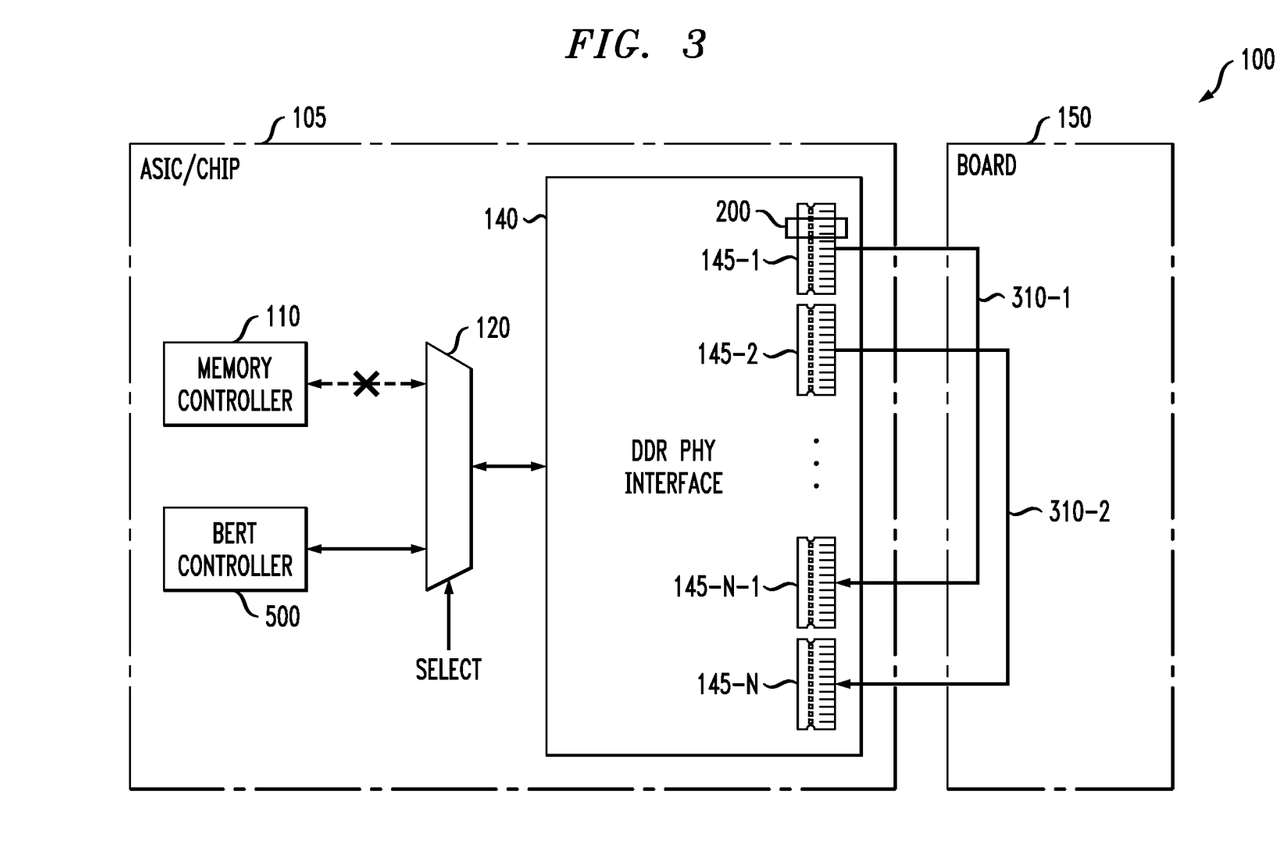
FIG. 3 illustrates the DDR memory system of FIG. 1 in an exemplary test or training mode.

FIG. 3 illustrates the DDR memory system 100 of FIG. 1 in an exemplary test mode. In particular, FIG. 3 illustrates how the memory controller 110, multiplexer 120, BERT controller 500 and DDR PHY interface 140 of FIG. 1 are configured during a test mode. According to one embodiment of the invention, during a test mode, pairs of byte lanes 145 are connected to one another to create a loopback path. In this manner, the BERT controller 500 can write a test pattern using a first byte lane 145 that is then read back for comparison using the paired second byte lane 145. In the exemplary embodiment of FIG. 3, byte lane 145-1 is connected to byte lane 145-N-1 using a first connection 310-1 and byte lane 145-2 is connected to byte lane 145-N using a second connection 310-2.

The paired connections 310 are preferably bidirectional. For example, in the exemplary embodiment of FIG. 3, where byte lane 145-1 is mapped to byte lane 145-N-1, byte lane 145-1 can first be configured by the BERT controller 500, e.g., to write a pattern that is then read from the paired byte lane 145-N-1. Thereafter, the direction of the mapping can be reversed by the BERT controller 500 such that byte lane 145-1 is then configured to read a pattern that was written using byte lane 145-N-1.

In this manner, half of the byte lanes 145 can initially be configured by the BERT controller 500 in a "write" mode, while the other half of the byte lanes 145 can be configured in a "read" mode. Thereafter, the direction of the mappings can be reversed by the BERT controller 500 to complete the testing. The BERT controller 500 verifies that the same pattern that was written by the BERT controller 500 using a first byte lane 145 was also read by the BERT controller 500 using the paired byte lane 145.

As previously indicated, the DDR memory devices 160 of FIG. 1 may optionally be part of one or more boards 150, such as a motherboard. The loopback connections 310 can optionally be on a different board 150 than the DDR memory devices 160. For example, the pair-wise connections 310 between byte lanes 145 can be achieved using predefined physical connections 310 through the same board 150 that contains one or more of the DDR memory devices 160, or through a dedicated board having predefined physical connections 310 provided for test purposes. In a further variation, a configurable board 150 can be provided whereby pair-wise connections between byte lanes 145 can be programmatically established.

Figure 4:
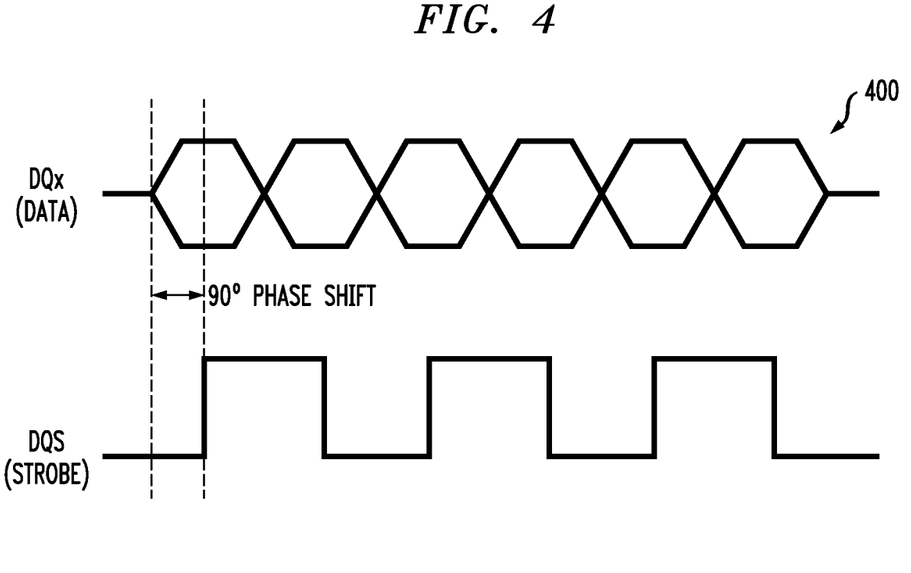
FIG. 4 is a timing diagram illustrating an exemplary phase relationship between a data signal DQ and a strobe signal DQS at the DDR PHY interface of FIG. 1.

FIG. 4 is a timing diagram 400 illustrating an exemplary phase relationship between a data signal DQ and a strobe signal DQS at the DDR PHY interface 140. In FIG. 4, DQS is center-aligned with DQ (i.e., a 90 degree phase offset) as transmitted by the memory controller 110 during a normal write operation. As previously indicated above, for a write operation during a test mode, the digital logic 220 for each bit within each byte lane 145 in a write mode adjusts the phase for each bit to ensure that DQS is edge-aligned with DQ (i.e., DQ and DQS are in phase).

Figure 5:
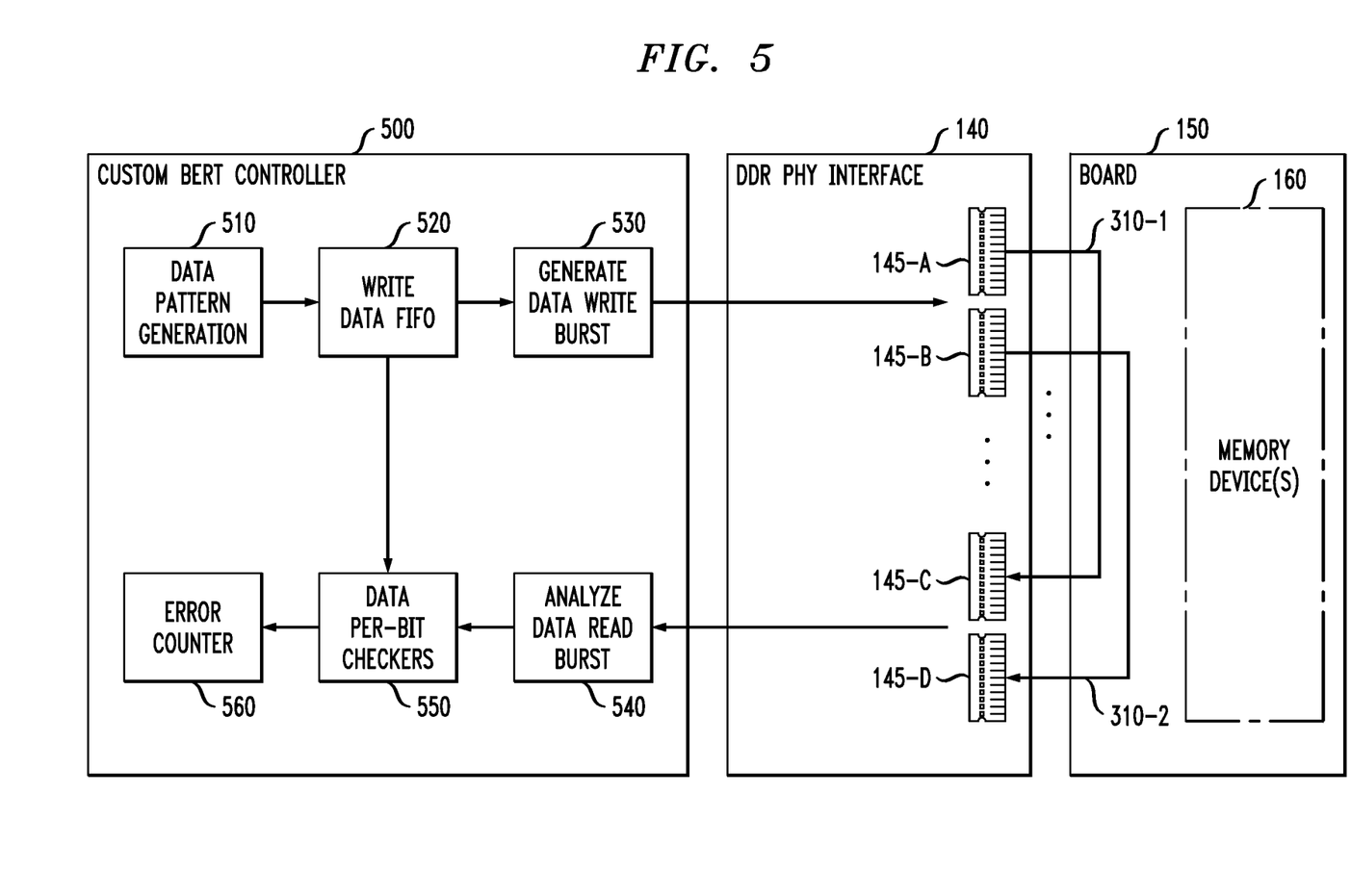
FIG. 5 illustrates the BERT controller of FIGS. 1 and 3 in further detail.

FIG. 5 illustrates the BERT controller 500 of FIGS. 1 and 3 in further detail. In the exemplary embodiment of FIG. 5, byte lane 145-A is connected (i.e., mapped) to byte lane 145-C and byte lane 145-B is connected (i.e., mapped) to byte lane 145-D. In addition, as shown in FIG. 5, byte lanes 145-A and 145-B are initially configured by the BERT controller 500 for testing in a write mode and byte lanes 145-C and 145-D are initially configured by the BERT controller 500 for testing in a read mode. Thereafter, byte lanes 145-A and 145-B can be configured by the BERT controller 500 for testing in a read mode while byte lanes 145-C and 145-D are configured by the BERT controller 500 for testing in a write mode.

As shown in FIG. 5, the BERT controller 500 comprises a write data pattern generator 510 that automatically generates a random or custom data pattern to be propagated through the write path in the DDR PHY interface 140. As used herein, the term "pattern" shall include a continuous stream of bits. The exemplary pattern depth is up to 128 bits and is transmitted through each byte lane 145 one byte at a time. The pattern is then stored in a write data FIFO 520, which is then referenced by the data per-bit checkers block 550 (in the read path of the BERT controller 500) to perform data comparison.

The BERT controller 500 generates a 'write' DDR burst at block 530. In the exemplary embodiment, the 'write' DDR burst emulates a DDR Jedec specification compliant write data burst. As indicated above, the main difference between a normal Jedec DDR write burst and the 'write' burst generated by the BERT controller 500 during a test mode is that the DQS/DQS# and DQ associated with the test pattern are in phase.

As indicated above, byte lanes 145-A and 145-B are configured in a 'write' mode, and the 'write' DDR burst is propagated through DDR byte lanes 145-A and 145-B.

In the read path, the byte lanes 145-C and 145-D are configured in a 'read' mode. The 'write' DDR burst is propagated through DDR Byte Lanes 145-A and 145-B and into DDR byte lanes 145-C and 145-D. The 'write' bursts through byte lanes 145-A and 145-B are considered 'read' bursts for byte lanes 145-C and 145-D. Since DQS/DQS[x] and DQ are in phase, this emulates the DDR Jedec compliant READ transaction. The 'read' burst is propagated through the DDR PHY interface 140 to the BERT controller 500.

The BERT controller 500 comprises a block 540 for analyzing the read data burst. The BERT controller 500 utilizes the data stored in the write data FIFO 520 to compare the incoming 'read' data using data per-bit checkers 550. A bit-by-bit data comparison is completed between the write pattern and the read pattern by the data per-bit checkers 550. An error counter 560 in the BERT controller 500 tracks the number of bit errors observed during the per-bit data comparison.

Once the testing for each pair of byte lanes 145 is completed for the initial configuration, then the configuration of each byte lane 145 in each pair is reversed (from write to read and vice versa) and the testing is repeated for each pair of byte lanes 145.

The DDR memory devices 160 are shown in FIG. 5 with a dashed outline to indicate that the presence of the DDR memory devices 160 is optional. All that is required is a loopback path 310 between each pair of byte lanes 145.

Figure 6:
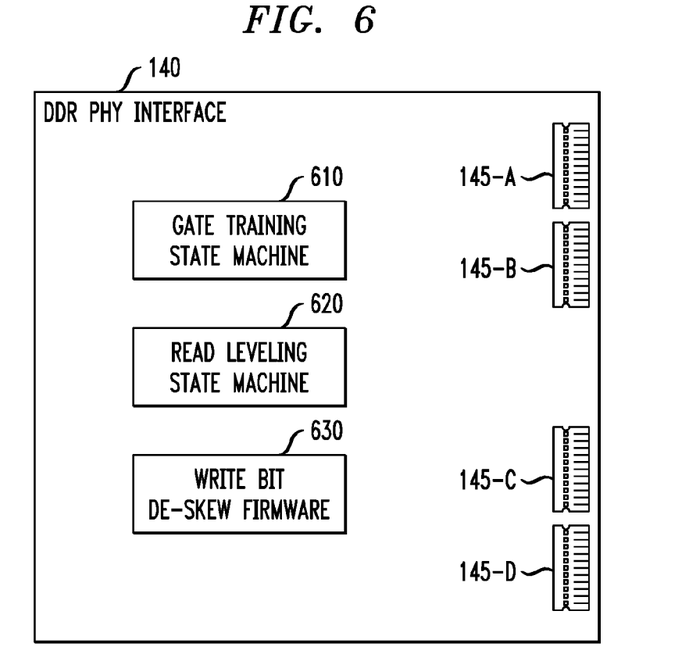
FIG. 6 illustrates the DDR PHY interface of FIGS. 1, 3 and 5 in further detail.

FIG. 6 illustrates the DDR PHY interface 140 of FIGS. 1, 3 and 5 in further detail. In the exemplary embodiment of FIG. 6, the DDR PHY interface 140 comprises a gate training state machine 610, a read leveling state machine 620 and a write bit de-skew firmware 630. The gate training state machine 610 implements a gate training process 800, as discussed further below in conjunction with FIG. 8. The read leveling state machine 620 implements a read leveling process 1000, as discussed further below in conjunction with FIG. 10. The write bit de-skew firmware 630 implements a write per-bit de-skew training process 1200, as discussed further below in conjunction with FIG. 12.

Figure 7:
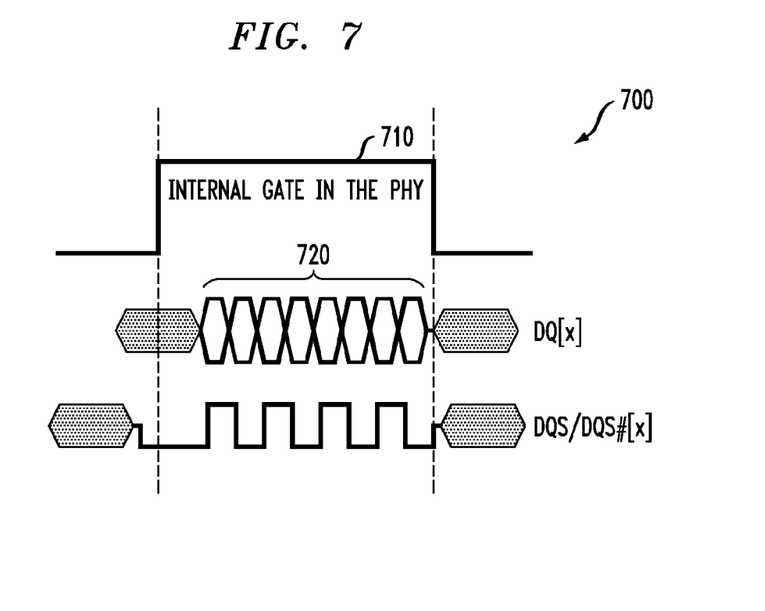
FIG. 7 is a timing diagram illustrating an exemplary phase relationship between a gate signal and the DQ and DQS signals of FIG. 4.

FIG. 7 is a timing diagram illustrating an exemplary phase relationship 700 between a gate signal 710 and the DQ and DQS signals of FIG. 4. During read operations, the gate signal 710 provides a window indicating when the read data is valid. Thus, during read operations, the DDR PHY interface 140 will use the gate signal 710 to 'gate' the read burst 720 such that only the signal transitions of the read burst 720 are captured by the DDR PHY interface 140. All other non-read burst signaling is 'gated' such that it does not propagate through the DDR PHY interface 140.

Figure 8:
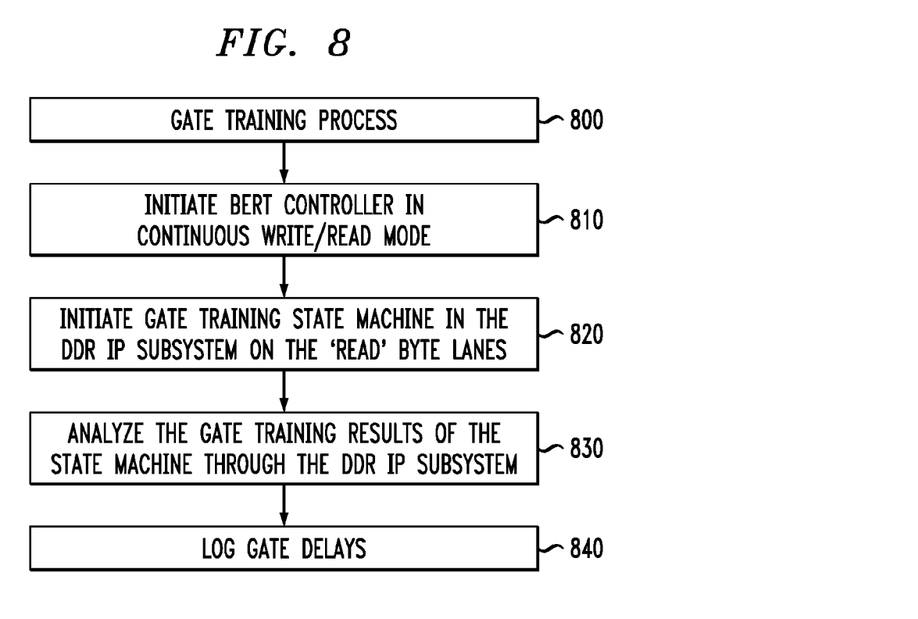
FIG. 8 is a flow chart describing an exemplary implementation of a gate training process that incorporates features of the present invention.

The internal gate signal 710 in the DDR PHY must be 'trained' to find the correct location to 'gate' the incoming read burst 720. If the 'gate' signal is not positioned correctly in the DDR PHY interface 140, then there will be read errors. Thus, a gate training process 800, as discussed further below in conjunction with FIG. 8, is employed to properly position the gate signal 710 to read the read burst 720. With conventional techniques, the read bursts 720 are typically provided by the DDR memory device 160. For normal operation, a conventional memory controller 110 would initiate continuous read bursts 720 from the memory device 160.

According to one aspect of the present invention, the gate training process 800 optimizes the timing of the gate signal 710 without requiring the presence of the DDR memory devices 160 or the DDR memory controller 110. In this manner, the BERT controller 500 provides the read bursts 720 for gate training through the loopback connections 310.

FIG. 8 is a flow chart describing an exemplary implementation of a gate training process 800 that incorporates features of the present invention.

To 'Train' the gate signal 710, the DDR PHY interface 140 needs continuous read bursts 720. Thus, as shown in FIG. 8, the exemplary gate training process 800 initially initiates the BERT controller 500 in a continuous write/read mode during step 810 to generate the continuous read bursts 720 and then initiates the gate training state machine 610 in the DDR PHY interface 140 on the 'read' byte lanes during step 820. In this manner, the DDR PHY interface 140 utilizes the read bursts 720 to find the correct location of the internal gate signal 710. The gate training state machine(s) 610 automatically analyze the incoming read bursts 720 and 'train' the gate signal 710 in the correct location to latch in the incoming read data of the read bursts 720. Once the DDR PHY gate training state machines 610 are completed, the gate delays are output by the state machines 610.

The gate training process 800 analyzes the gate training results (i.e., the output gate delays) of the state machine 610 through the DDR PHY interface 140 during step 830 and then logs the Gate Delays during step 840.

Figure 9A:
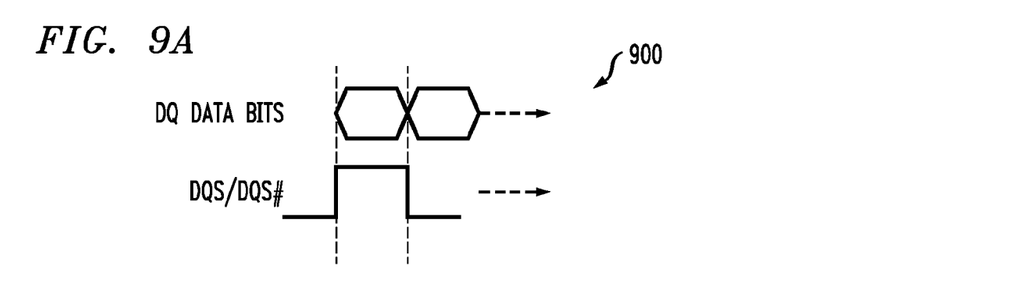
FIGS. 9A and 9B are timing diagrams illustrating exemplary phase relationships between the DQ and DQS signals of FIG. 4.
Figure 9B:
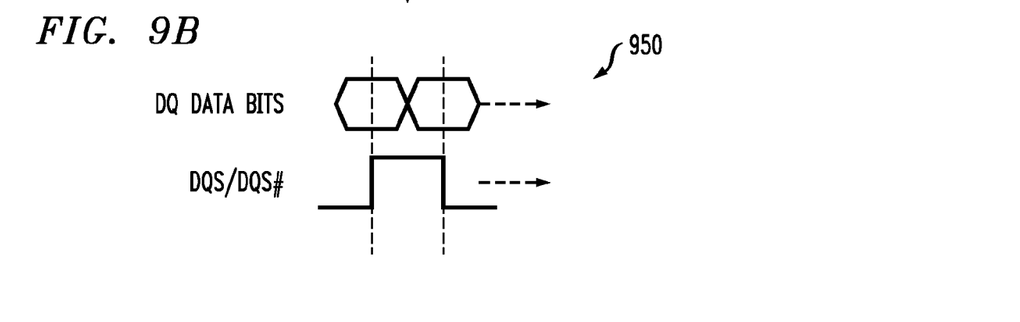

FIGS. 9A and 9B are timing diagrams 900, 950, respectively, illustrating exemplary phase relationships between the DQ and DQS signals of FIG. 4. FIG. 9A illustrates a read burst having the data bits in the DQ signal in phase with the DQS/DQS# strobe signal at the DDR PHY interface 140. For all DDR3 designs, the data bits in the DQ[x] signal for a memory read burst are phase aligned with the DQS/DQS# strobe signal, as shown in FIG. 9A. See, for example, JEDEC DDR3 SDRAM standard (see, JEDEC Solid State Technology Association, http://www.jedec.org/standards-documents/docs/jesd-79-3d).

The DDR PHY interface 140 is responsible for adding a 90 degree phase shift to the incoming DQS/DQS# signal such that the DQS/DQS# signal is now in the 'middle' of the data bit window (i.e., DQS is center-aligned with DQ). FIG. 9B illustrates a read burst having the data bits in the DQ signal 90 degrees out of phase with the DQS/DQS# strobe signal at the DDR PHY interface 140.

Thus, the DDR PHY interface 140 must be trained to position the DQS/DQS# signal in the 'middle' of the data bit window (i.e., DQS is center-aligned with DQ). Read leveling is the process of 'training' the DQS/DQS# to be positioned in the middle of the DQ bit window. Conventional read level processes require the memory controller 110 to continuously initiate either memory read bursts from the memory device 160 until the DDR PHY interface 140 has completed the read level 'training'.

According to one aspect of the present invention, the read leveling process 1000, as discussed further below in conjunction with FIG. 10, positions the DQS/DQS# signal in the 'middle' of the data bit window without requiring the presence of the DDR memory devices 160 or the DDR memory controller 110. In this manner, the BERT controller 500 provides the read bursts 720 for read level training with the DQ and DQS signals in phase through the loopback connections 310.

Figure 10:
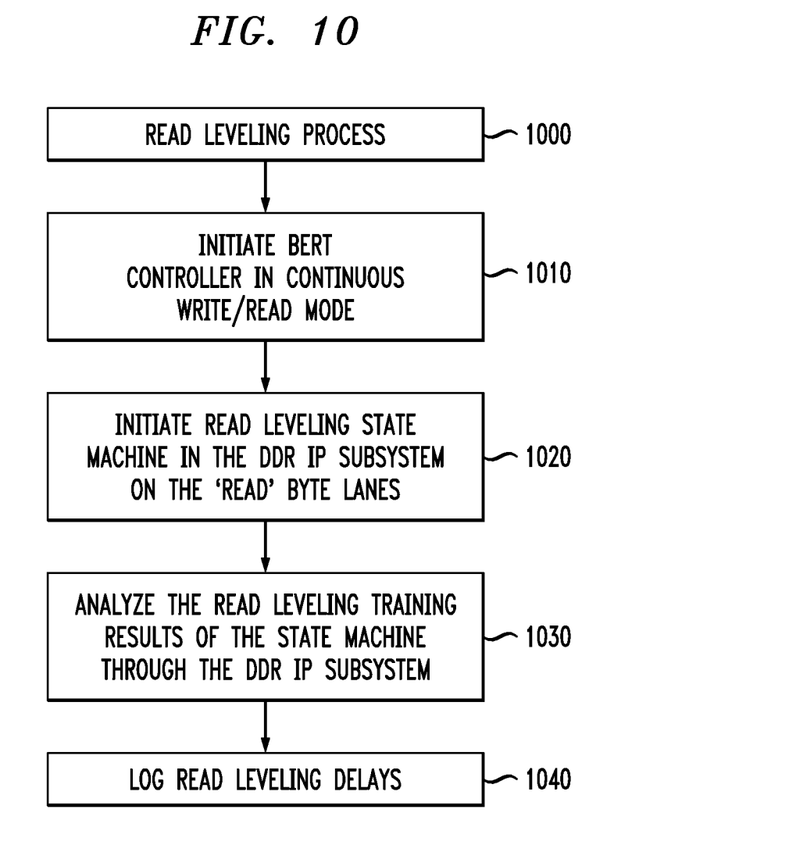
FIG. 10 is a flow chart describing a read leveling process that incorporates an embodiment of the present invention.

FIG. 10 is a flow chart describing an exemplary implementation of a read leveling process 1000 that incorporates features of the present invention. As shown in FIG. 10, the exemplary gate training process 1000 initially initiates the BERT controller 500 in a continuous write/read mode during step 1010 and then initiates the read leveling state machine 620 in the DDR PHY interface 140 on the 'read byte' lanes 145 during step 1020. The internal read leveling state machine 620 'trains' (i.e., centers) the DQS/DQS# in the middle of the DQ bit period during step 1020.

Once the DDR PHY read leveling state machine(s) 620 have completed, the read leveling delays outputted from the state machines 620 are analyzed by the read leveling process 1000 during step 1030. Finally, the read leveling process 740 logs the read leveling delays during step 1040 for future reference and the read leveling process 1000 and read leveling state machine 620 can be verified/validated.

Figure 11A:
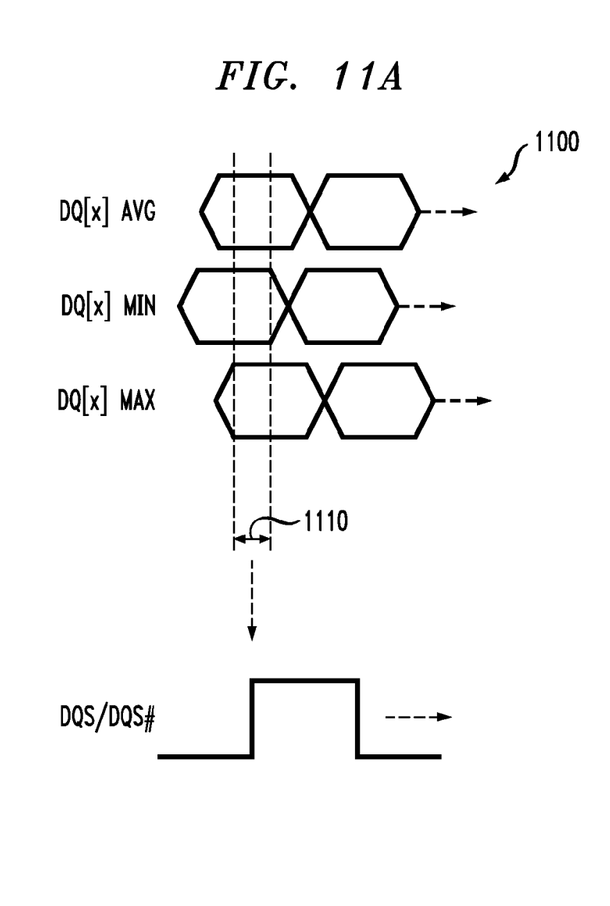
FIGS. 11A and 11B are timing diagrams illustrating exemplary phase relationships between the DQ signal for multiple bits and the DQS signal of FIG. 4.
Figure 11B:
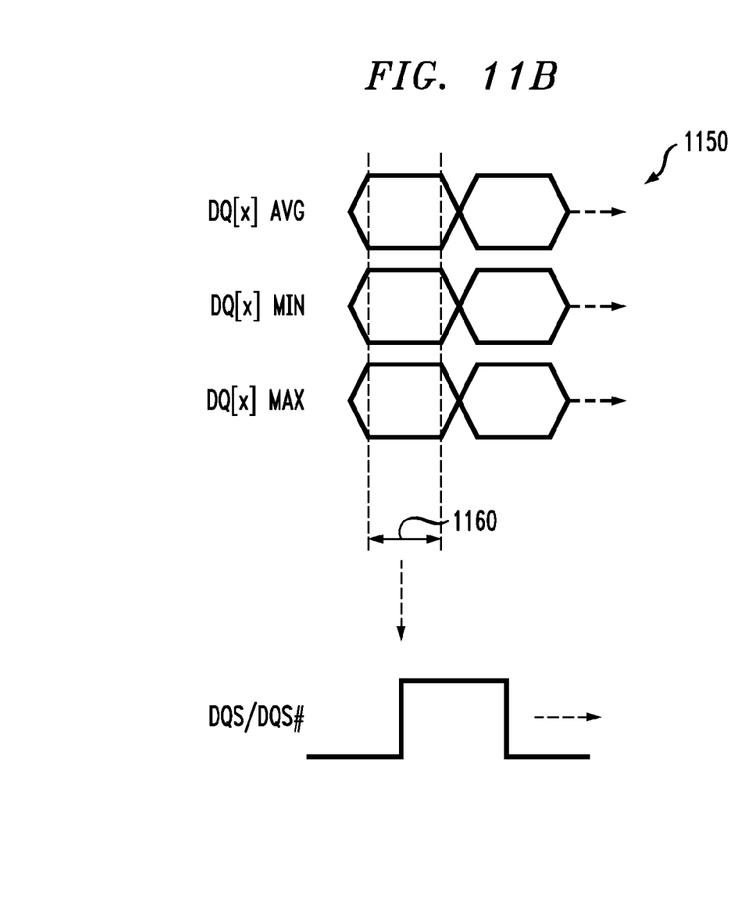

FIGS. 11A and 11B are timing diagrams 1100, 1150, respectively, illustrating exemplary phase relationships between the DQ signal for multiple bits and the DQS signal of FIG. 4. As previously indicated, during a normal write operation for DDR3 designs, DQS should be center-aligned with DQ (i.e., a 90 degree phase offset). The DDR PHY interface 140 adds the 90 degree phase offset to the outgoing DQS/DQS# signal. As shown in FIG. 11A, the eight DQ bits in a byte lane of the exemplary embodiment are typically not optimally aligned (e.g., due to skew and jitter). Thus, if not corrected, the edge of the DQS/DQS# signal must be placed in a narrow window 1110 to properly latch all of the DQ bits.

To increase the window 1110 where the edge of the DQS/DQS# can be placed, the DQ[x] and DM[x] bits can be optimally aligned using the write per-bit de skew firmware 630. The the write per-bit de skew firmware 630 implements a the write per-bit de-skew training process 1200, as discussed further below in conjunction with FIG. 12. After the de-skew training, the DQS/DQS# will have a wider window 1160, as shown in FIG. 11B, to be optimally placed and provide additional setup and hold timing margins to the memory for a more robust system design.

Conventional write per-bit de-skew training processes require the memory controller 110 to continuously initiate write and read operations to and from the memory device 160 until the DDR PHY interface 140 has completed the write per-bit de-skew 'training'.

According to one aspect of the present invention, the write per-bit de-skew training process 1200, as discussed further below in conjunction with FIG. 12, validates the write-bit-deskew firmware 630. The BERT controller 500 initiates the write/read tests without requiring the presence of the DDR memory devices 160 or the DDR memory controller 110. In this manner, the BERT controller 500 provides the write/read bursts for write per-bit de-skew training through the loopback connections 310.

Figure 12:
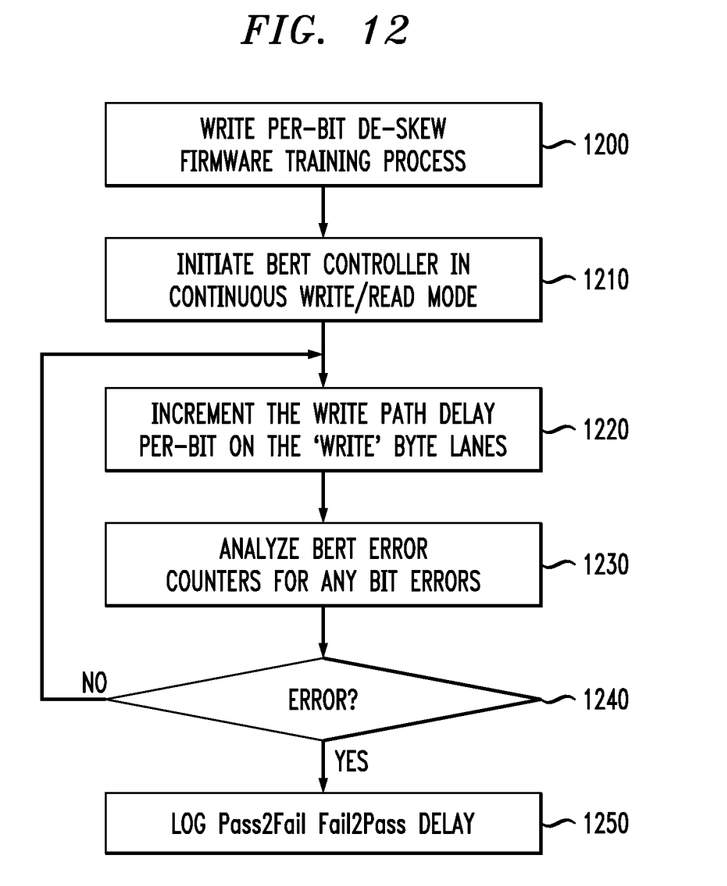
FIG. 12 is a flow chart describing a write per-bit de-skew training process that incorporates an embodiment of the present invention.

FIG. 12 is a flow chart describing an exemplary implementation of a write per-bit de-skew training process 1200 that incorporates features of the present invention. As shown in FIG. 12, the exemplary gate training process 1200 initially initiates the BERT controller 500 in a continuous write/read mode during step 1210 and then increments the write path delay per-bit on the 'write' byte lanes 145 during step 1220. The DQ bit alignment is trained by initiating code in the firmware 630 to walk through the delay range of the DQ path until a failure is logged. The write per-bit de-skew training process 1200 then analyzes the BERT Error Counters for any bit errors during step 1230. The firmware 630 analyzes the failure and delay taps utilized in the DDR PHY interface 140 to determine the optimal alignment of the DQ bits.

A test is performed during step 1240 to determine if there is an error. If it is determined during step 1240 that there is not an error, then program control returns to step 1220 and continues in the manner described above. If, however, it is determined during step 1240 that there is an error, then the write per-bit de-skew training process 1200 logs Pass2Fail and Fail2Pass delay values during step 1250. This process will be repeated until all DQ bits have been aligned.

CONCLUSION

In an integrated circuit embodiment of the invention, multiple integrated circuit dies are typically formed in a repeated pattern on a surface of a wafer. Each such die may include a device as described herein, and may include other structures or circuits. The dies are cut or diced from the wafer, then packaged as integrated circuits. One skilled in the art would know how to dice wafers and package dies to produce packaged integrated circuits. Integrated circuits so manufactured are considered part of this invention.

While embodiments of the present invention have been described with respect to processing steps in a software program, as would be apparent to one skilled in the art, various functions may be implemented in the digital domain as processing steps in a software program, in hardware by a programmed general-purpose computer, circuit elements or state machines, or in combination of both software and hardware. Such software may be employed in, for example, a hardware device, such as a digital signal processor, application specific integrated circuit, micro-controller, or general-purpose computer. Such hardware and software may be embodied within circuits implemented within an integrated circuit.

Thus, the functions of the present invention can be embodied in the form of methods and apparatuses for practicing those methods. One or more embodiments of the present invention can be manifest in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing embodiments of the invention. When implemented on a general-purpose processor, the program code segments combine with the processor to provide a device that operates analogously to specific logic circuits. Embodiments of the invention can also be implemented in one or more of an integrated circuit, a digital signal processor, a microprocessor, and a micro-controller.

System and Article of Manufacture Details

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a recordable medium (e.g., floppy disks, hard drives, compact disks, memory cards, semiconductor devices, chips, application specific integrated circuits (ASICs)) or may be a transmission medium (e.g., a network comprising fiber-optics, the worldwide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The computer systems and servers described herein each contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

We claim:

1. An integrated circuit, comprising:
a bit error test controller that provides a bit pattern; and
a physical interface having a plurality of byte lanes, wherein said physical interface converts digital signals from the bit error test controller into waveforms for one or more memory devices, wherein at least a first byte lane is connected by a loopback path to a second byte lane and wherein said bit error test controller provides said bit pattern using a write operation that is then obtained using said loopback path to evaluate said physical interface based on said bit pattern.

2. The integrated circuit of claim 1, wherein said evaluation comprises a verification that said bit pattern that was written was also read by said bit error test controller.

3. The integrated circuit of claim 1, wherein said evaluation comprises a gate training process to position a gate signal for reading one or more read bursts.

4. The integrated circuit of claim 1, wherein said evaluation comprises a read leveling training process to position an edge of a strobe signal substantially in a middle of a data bit window.

5. The integrated circuit of claim 1, wherein said evaluation comprises a write bit de-skew training process to substantially align a plurality of bits in a byte lane.

6. The integrated circuit of claim 1, further comprising a memory controller that drives said physical interface with write operations to said one or more memory devices and read operations from said one or more memory devices.

7. The integrated circuit of claim 6, further comprising a multiplexer that selects an output from one or more of said memory controller and said bit error test controller.

8. The integrated circuit of claim 7, wherein said multiplexer selects said output based on whether said integrated circuit is in one or more of a normal operating mode and an evaluation mode.

9. The integrated circuit of claim 1, wherein said one or more memory devices comprise one or more double data rate memories.

10. The integrated circuit of claim 1, wherein said bit pattern comprises a continuous stream of bits.

11. An Application Specific Integrated Circuit (ASIC), comprising:
a bit error test controller that generates a bit pattern;
a physical interface having a plurality of byte lanes, wherein said physical interface converts digital signals from the bit error test controller into waveforms, wherein at least a first byte lane is connected by a loopback path to a second byte lane and wherein said bit error test controller provides said bit pattern using a write operation that is then obtained using said loopback path to evaluate said physical interface based on said bit pattern; and
a memory controller that drives the physical interface with write operations to the one or more memory devices and read operations from the one or more memory devices.

12. The ASIC of claim 11, wherein the evaluation comprises a verification that the bit pattern was written was also ready by the bit error test controller.

13. The ASIC of claim 11, wherein said evaluation comprises a gate training process to position a gate signal for reading one or more read bursts.

14. The ASIC of claim 11, wherein said evaluation comprises a read leveling training process to position an edge of a strobe signal substantially in a middle of a data bit window.

15. The ASIC of claim 11, wherein said evaluation comprises a write bit de-skew training process to substantially align a plurality of bits in a byte lane.

16. The ASIC of claim 11, further comprising:
a multiplexer that selects an output from one or more of said memory controller and said bit error test controller.

17. The ASIC of claim 16, wherein said multiplexer selects said output based on whether said integrated circuit is in one or more of a normal operating mode and an evaluation mode.

18. The ASIC of claim 11, wherein said one or more memory devices comprise one or more double data rate memories.

19. The ASIC of claim 11, wherein said bit pattern comprises a continuous stream of bits.

* * * * *